(12) United States Patent
Lam et al.

(10) Patent No.: US 9,553,173 B1
(45) Date of Patent: Jan. 24, 2017

(54) ASYMMETRIC FINFET MEMORY ACCESS TRANSISTOR

(71) Applicant: International Business Machines Corporation, Armonk, NY (US)

(72) Inventors: Chung H. Lam, Peekskill, NY (US); Chung-hsun Lin, White Plains, NY (US); Darsen D. Lu, Mount Kisco, NY (US); Philip J. Oldiges, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/962,082

(22) Filed: Dec. 8, 2015

Related U.S. Application Data

(63) Continuation of application No. 14/865,276, filed on Sep. 25, 2015.

(51) Int. Cl.
| | |
|---|---|
| *H01L 21/336* | (2006.01) |
| *H01L 29/66* | (2006.01) |
| *H01L 21/306* | (2006.01) |
| *H01L 21/311* | (2006.01) |
| *H01L 21/02* | (2006.01) |
| *H01L 29/08* | (2006.01) |
| *H01L 21/308* | (2006.01) |

(52) U.S. Cl.
CPC ... *H01L 29/66795* (2013.01); *H01L 21/02532* (2013.01); *H01L 21/3081* (2013.01); *H01L 21/30604* (2013.01); *H01L 21/31111* (2013.01); *H01L 29/0847* (2013.01); *H01L 29/6653* (2013.01)

(58) Field of Classification Search
CPC .................. H01L 21/823431; H01L 27/0886; H01L 27/0924; H01L 27/10826; H01L 29/41791; H01L 29/785; H01L 27/11266; H01L 29/6672; H01L 29/66795; H01L 29/7831
USPC .......... 257/61, 135, 288, 368, 369; 438/151, 438/197, 199, 301
See application file for complete search history.

(56) References Cited

U.S. PATENT DOCUMENTS

| | | | | |
|---|---|---|---|---|
| 2007/0148939 | A1* | 6/2007 | Chu ................... | H01L 21/82380 438/590 |
| 2011/0193164 | A1* | 8/2011 | Zhu ................... | H01L 29/66795 257/347 |
| 2016/0005850 | A1* | 1/2016 | Zhao ..................... | H01L 29/781 257/329 |

OTHER PUBLICATIONS

Chung H. Lam, et al., "Asymmetric Finfet Memory Access Transistor", U.S. Appl. No. 14/865,276, filed Sep. 25, 2015.
(Continued)

*Primary Examiner* — Jarrett Stark
*Assistant Examiner* — Shahed Ahmed
(74) *Attorney, Agent, or Firm* — Cantor Colburn LLP; Vazken Alexanian

(57) ABSTRACT

A field effect transistor device comprises a semiconductor substrate, a doped source layer arranged on the semiconductor substrate, an insulator layer arranged on the doped source layer, a fin arranged on the insulator layer, a source region extension portion extending from the doped source layer and through the fin, a gate stack arranged over a channel region of the fin and adjacent to the source region extension portion, a drain region arranged on the fin adjacent to the gate stack; the drain region having a graduated doping concentration.

15 Claims, 21 Drawing Sheets

(56) References Cited

OTHER PUBLICATIONS

List of IBM Patents or Patent Applications Treated as Related; (Appendix P), Filed Feb. 22, 2016, 2 pages.

* cited by examiner

US 9,553,173 B1

ASYMMETRIC FINFET MEMORY ACCESS TRANSISTOR

DOMESTIC PRIORITY

This application is a continuation of U.S. Non-Provisional application Ser. No. 14/865,276, entitled "ASYMMETRIC FINFET MEMORY ACCESS TRANSISTOR", filed Sep. 25, 2015, which is incorporated herein by reference in its entirety.

BACKGROUND

The present invention relates to field effect transistor (FET) devices. A FET is a transistor device having a channel region that is partially defined by a gate. The FET device uses an electric field to control the conductivity of the channel region.

Solid state memory devices include memory devices that use integrated circuits to store data. Solid state memory devices include NAND based flash memory, which retains data even if power is not supplied to the solid state memory. Random access memory (RAM) includes integrated circuits that typically do not retain stored data when power is not supplied to the RAM.

In solid state memory devices, an array of FET devices is arranged on a substrate. The FET devices often use a common source region that is arranged on the substrate. It is desirable in memory devices to increase the number of FET devices on a substrate to increase the memory capacity of the memory devices.

SUMMARY

According to an embodiment of the present invention, a method for fabricating a field effect transistor device comprises forming a doped layer on a semiconductor substrate, forming a sacrificial layer on the doped layer, forming a fin on the sacrificial layer, the fin having a nitride portion and a semiconductor portion, etching to remove a portion of the semiconductor portion of the fin to expose a portion of the doped layer, growing a semiconductor material from the exposed portion of the doped layer, depositing a first nitride layer on the fin, patterning and etching to remove portions of the nitride layer and define a channel region on the fin, etching to remove the sacrificial layer and form a void that exposes a portion of the doped layer, depositing an insulator material in the void and the channel region of the fin, etching to remove a portion of the insulator material and expose the channel region of the fin, and forming a gate stack over the channel region of the fin.

According to another embodiment of the present invention, a method for fabricating a field effect transistor device comprises forming a doped layer on a semiconductor substrate, forming a sacrificial layer on the doped layer, growing a semiconductor layer on the sacrificial layer, patterning the semiconductor layer to form a fin, removing a portion of the fin, forming a nitride portion of the fin, patterning a hardmask layer on the fin, etching to remove an exposed portion of the fin and the sacrificial layer to form a cavity that exposes a portion of the doped layer, growing a semiconductor material in the cavity, forming a spacer on the fin and around the grown semiconductor material, depositing a first nitride layer on the fin, removing the spacer, depositing a second nitride layer on the fin, patterning and etching to remove portions of the nitride layer and define a channel region on the fin, etching to remove the sacrificial layer and form a void that exposes a portion of the doped layer, depositing an insulator material in the void and the channel region of the fin, etching to remove a portion of the insulator material and expose the channel region of the fin, and forming a gate stack over the channel region of the fin.

According to another embodiment of the present invention, a field effect transistor device comprises a semiconductor substrate, a doped source layer arranged on the semiconductor substrate, an insulator layer arranged on the doped source layer, a fin arranged on the insulator layer, a source region extension portion extending from the doped source layer and through the fin, a gate stack arranged over a channel region of the fin and adjacent to the source region extension portion, a drain region arranged on the fin adjacent to the gate stack; the drain region having a graduated doping concentration.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
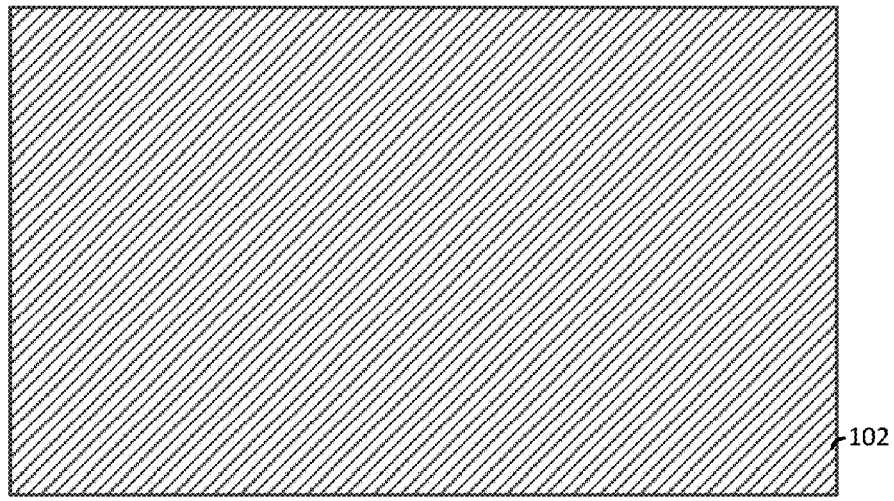
FIG. 1A illustrates a top view of a substrate.

Memory devices often include a large number of FET devices densely arranged on a substrate. FinFET devices are multi-gate FET devices having a fin that defines a channel region of the device. FinFET devices for memory applications use a common source region that allows the devices to be densely arranged on the substrate.

Conventional FinFET devices may use lightly-doped common source and drain regions to suppress the leakage current during read and programming conditions. However, the lightly doped active regions degrade the access transistor drive current during programming. This is caused by high parasitic resistance due to spreading resistance.

The embodiments described below provide a heavily doped common source region that reduces parasitic resistance during programming, while maintaining a low leakage current. The lightly doped or underlapped drain area maintains low leakage current. Thus, the highly doped source region and lightly doped drain region result in a FET device with asymmetric doping density in the source and drain regions, and improves the drive current in the devices.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1B:
FIG. 1B illustrates a side view of FIG. 1A.

FIG. 1A illustrates a top view of a substrate 102 that includes a semiconductor material. FIG. 1B illustrates a side view of FIG. 1A. Non-limiting examples of suitable substrate materials include silicon, silicon dioxide, aluminum oxide, sapphire, germanium, gallium arsenide (GaAs), an alloy of silicon and germanium, indium phosphide (InP), or any combination thereof. Other examples of suitable substrates include silicon-on-insulator (SOI) substrates with buried oxide (BOX) layers. The thickness of the substrate is not intended to be limited.

Figure 2A:
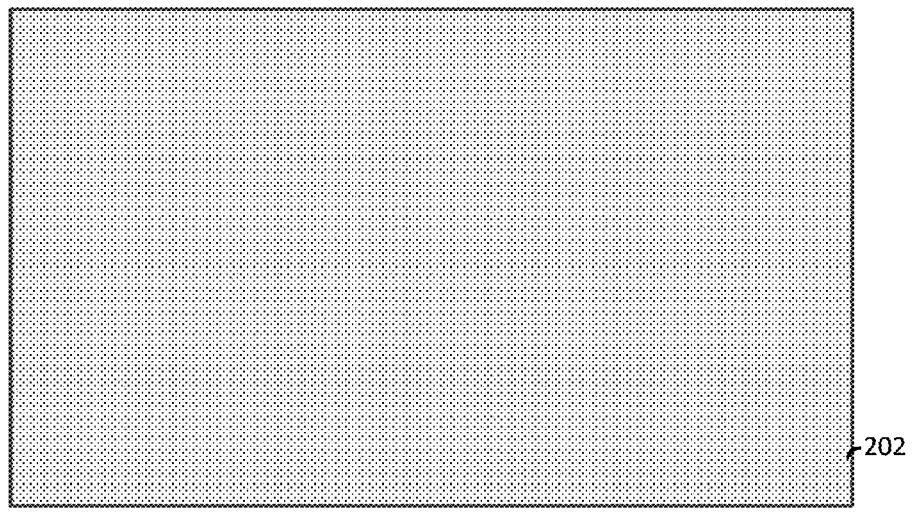
FIG. 2A illustrates a top view of a source region formed on the substrate.
Figure 2B:
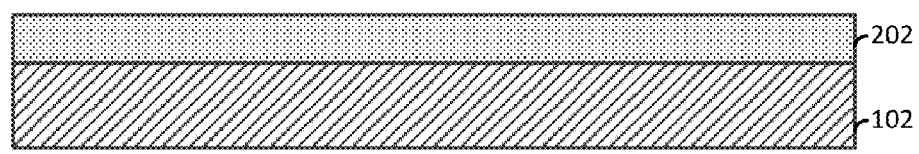
FIG. 2B illustrates a side view of FIG. 2A.

FIG. 2A illustrates a top view of a source region 202 that is arranged on the substrate 102. The source region 202 includes a highly doped semiconductor material that, in the illustrated embodiment is N+ doped with, for example phosphorus. The source region 202 may be formed by, for example, implanting ions in the substrate 102 or epitaxially growing a semiconductor material such as silicon on the substrate 102. The epitaxially grown semiconductor material may be doped by ion implantation or doped in-situ during the epitaxial growth process. FIG. 2B illustrates a side view of FIG. 2A.

Figure 3A:
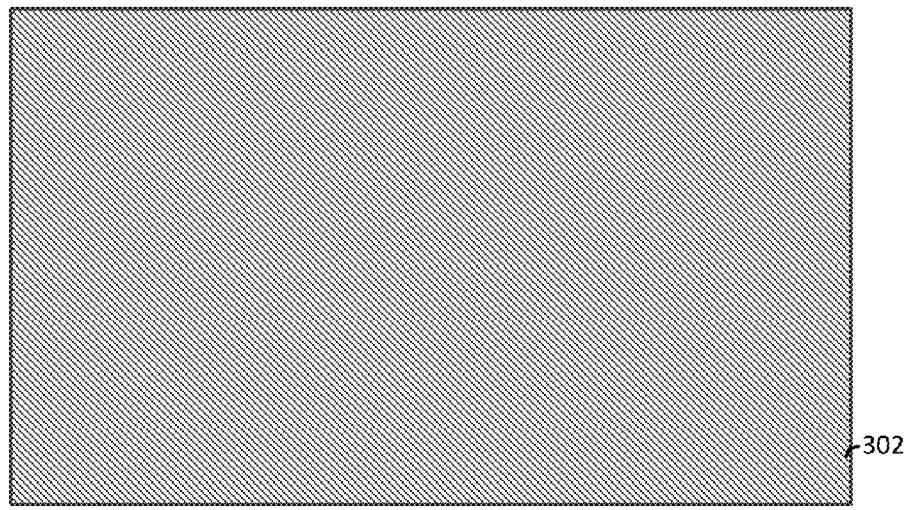
FIG. 3A illustrates a top view of a sacrificial layer formed on the source region.
Figure 3B:
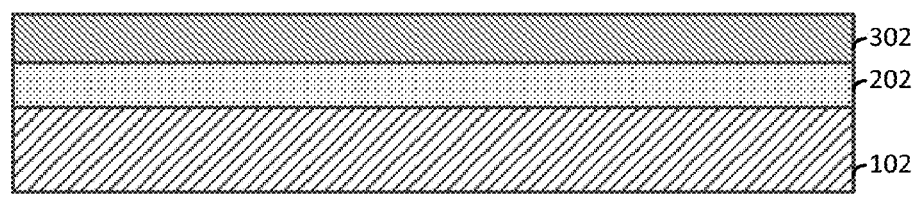
FIG. 3B illustrates a side view of FIG. 3A.

FIG. 3A illustrates a top view of a layer of silicon germanium (SiGe) that defines a sacrificial layer 302 that is epitaxially grown on the exposed portions of the source region 202. Though the illustrated embodiment includes SiGe, alternate embodiments may include another semiconductor material that provides selectivity during etching. FIG. 3B illustrates a side view of FIG. 3A.

Figure 4A:
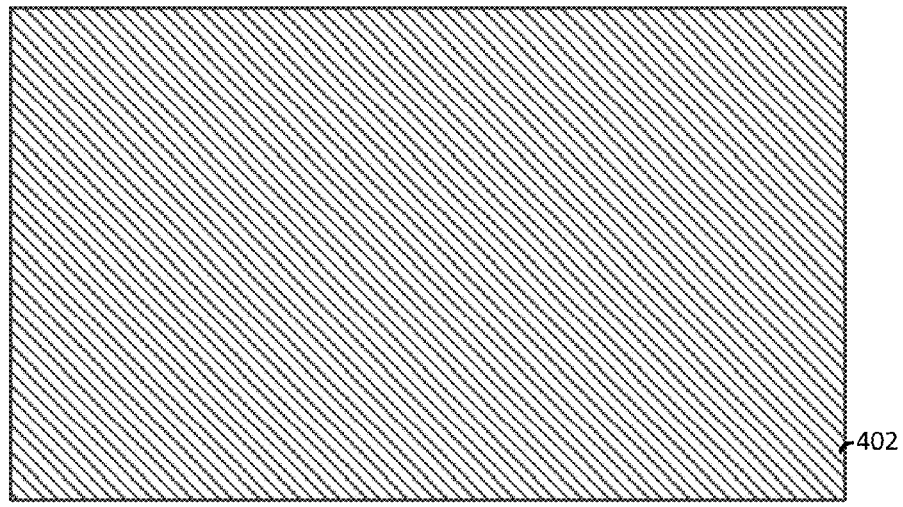
FIG. 4A illustrates a top view of a semiconductor material layer formed on the sacrificial layer.
Figure 4B:
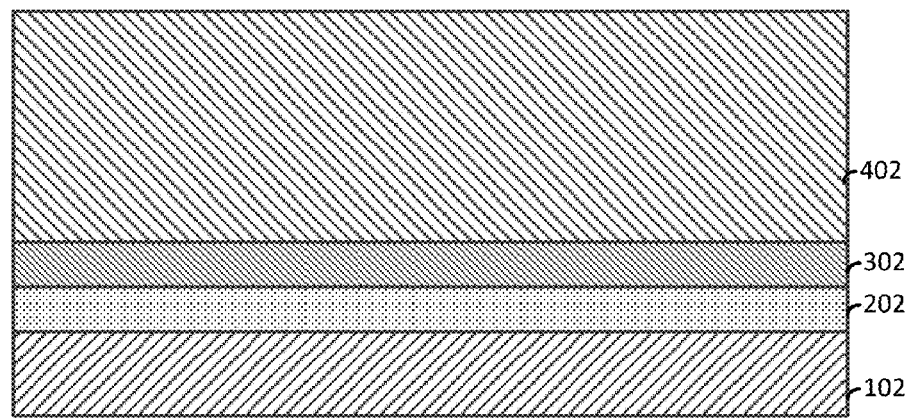
FIG. 4B illustrates a side view of FIG. 4A.

FIG. 4A illustrates a top view of a semiconductor material layer 402 that is epitaxially grown on the sacrificial layer 302. The semiconductor material layer 402 in the illustrated embodiment includes epitaxially grown silicon, but may include other semiconductor materials in alternate embodiments. FIG. 4B illustrates a side view of FIG. 4A.

Figure 5A:
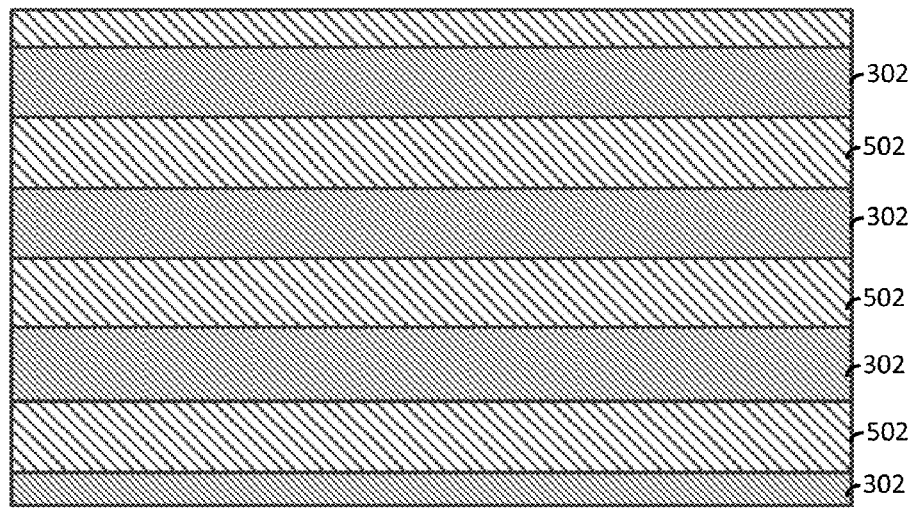
FIG. 5A illustrates the resultant structure following a lithographic patterning and etching process.
Figure 5B:
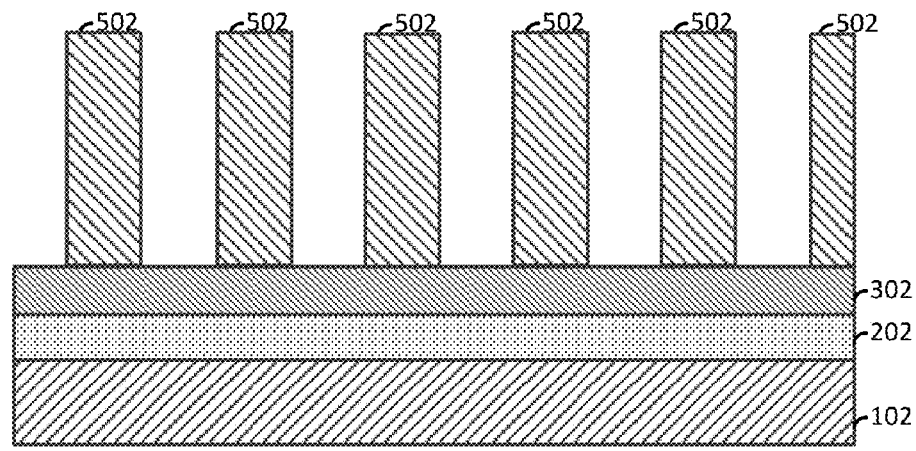
FIG. 5B illustrates a side view of FIG. 5A.

FIG. 5A illustrates the resultant structure following a lithographic patterning and etching process such as, for example, reactive ion etching (RIE) that removes portions of the semiconductor material layer 402 to expose portions of the sacrificial layer 302 and define a fins 502 from the semiconductor material layer 502. FIG. 5B illustrates a side view of FIG. 5A.

Figure 6A:
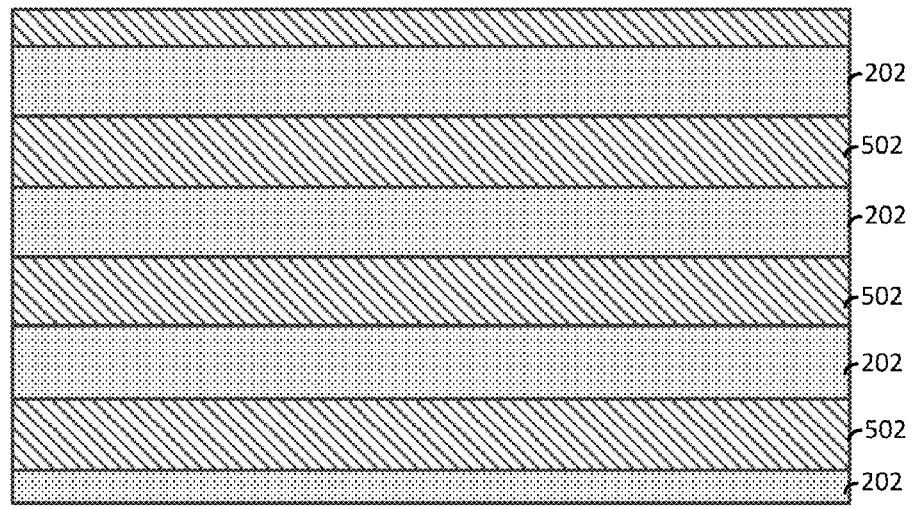
FIG. 6A illustrates the resultant structure following a lithographic patterning and etching process.
Figure 6B:
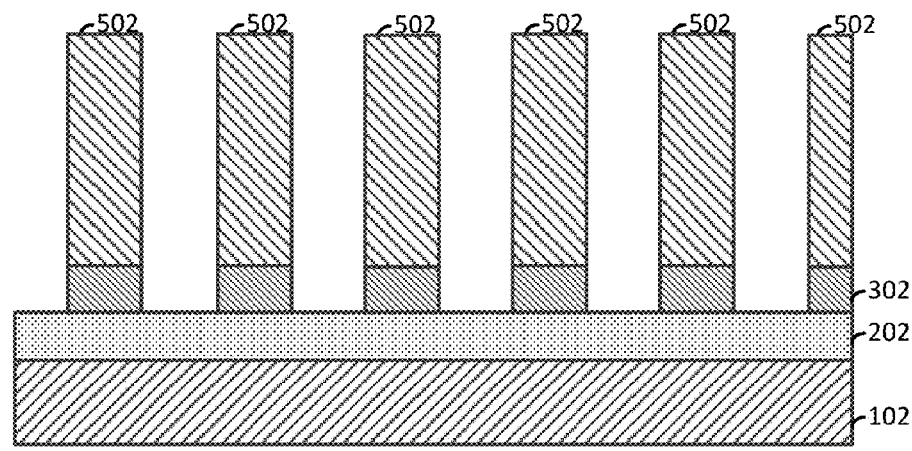
FIG. 6B illustrates a side view of FIG. 6A.

FIG. 6A illustrates the resultant structure following a lithographic patterning and etching process such as, for example, RIE that removes portions of the sacrificial layer 302 below the fin 502 to expose portions of the source layer 202. FIG. 6B illustrates a side view of FIG. 6A.

Figure 7A:
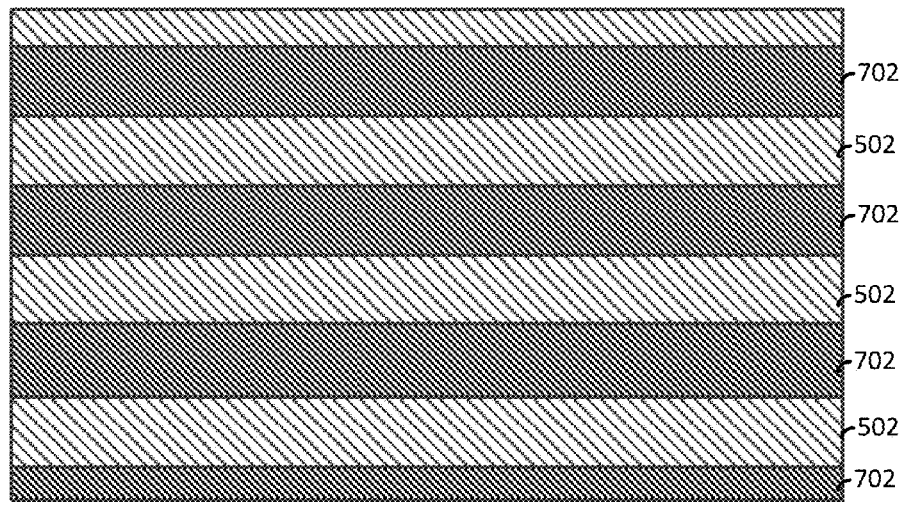
FIG. 7A illustrates a top view following the growth of a nitride layer.
Figure 7B:
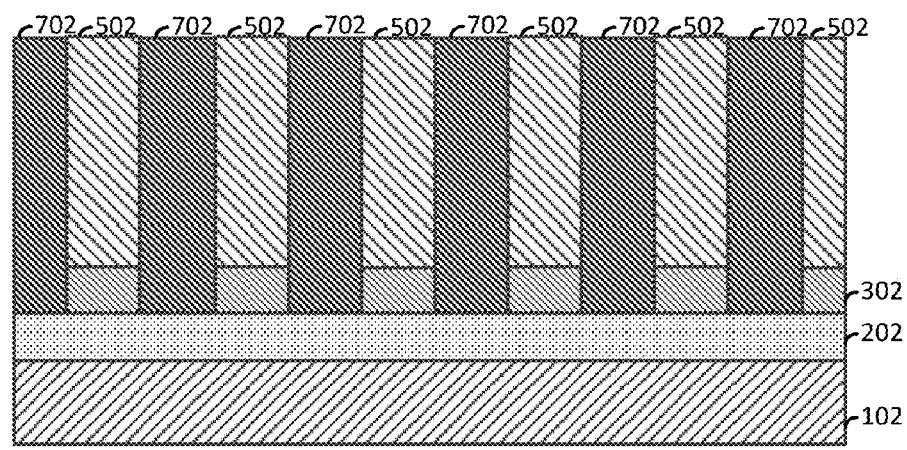
FIG. 7B illustrates a side view of FIG. 7A.
Figure 7C:
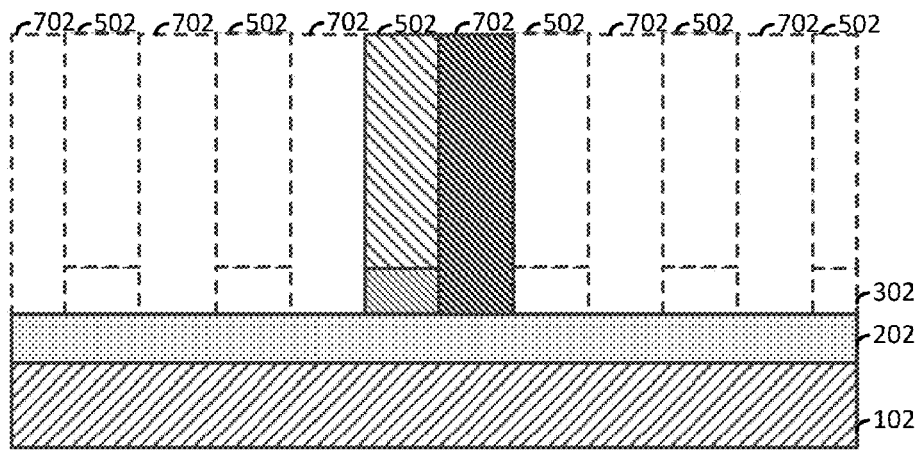
FIG. 7C illustrates a side view of FIG. 7A.

FIG. 7A illustrates a top view following the growth of a nitride layer 702 on exposed portions of the source layer 202. The nitride is formed by a blanket deposition process followed by a planarization process such as, for example, chemical mechanical polishing (CMP). FIG. 7B illustrates a side view of FIG. 7A. FIG. 7C illustrates another side view of FIG. 7A similar to FIG. 7B. For illustrative purposes, only a single fin 502 and nitride layer 702 are shown in FIG. 7C with the position of the other features shown in dashed lines. In the following figures, the single fin 502 and nitride layer 702 are shown to more clearly describe the embodiments. One of ordinary skill in the art would understand that the method described in the subsequent steps may be applied to any number of fins 502 substantially simultaneously.

Figure 8:
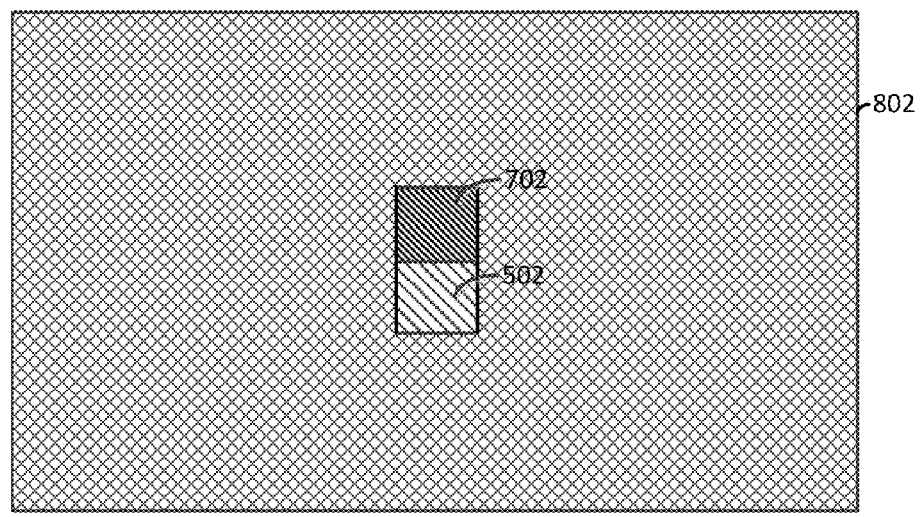
FIG. 8 illustrates a top view of a hardmask.

FIG. 8 illustrates a top view of a hardmask 802 that has been patterned over the fin 502, the nitride layer 702 and the sacrificial layer 302. The hardmask 802 may include, for example, an oxide material such as silicon oxide.

Figure 9:
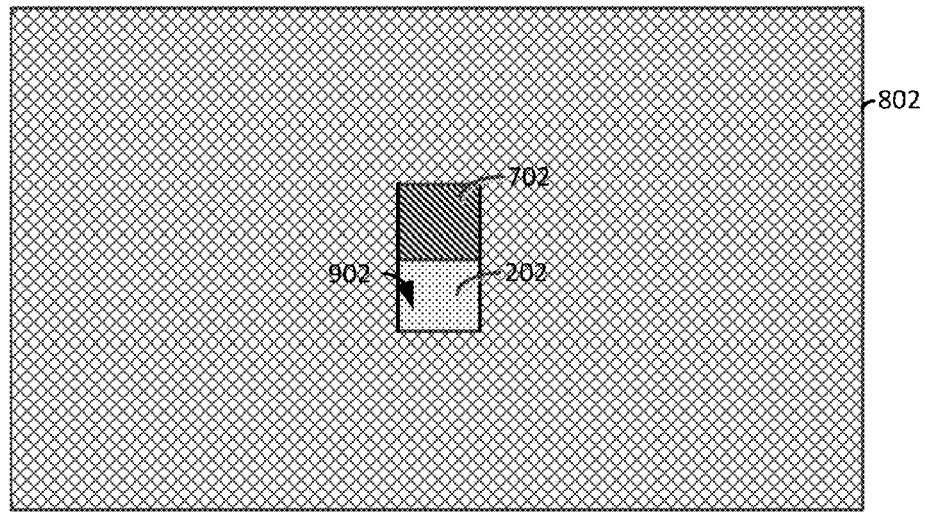
FIG. 9 illustrates a top view following a selective etching process.

FIG. 9 illustrates a top view following a selective etching process such as, for example, RIE that removes exposed portions of the fin 502 and the sacrificial layer 302 to form a cavity 902 that exposes the source layer 202.

Figure 10A:
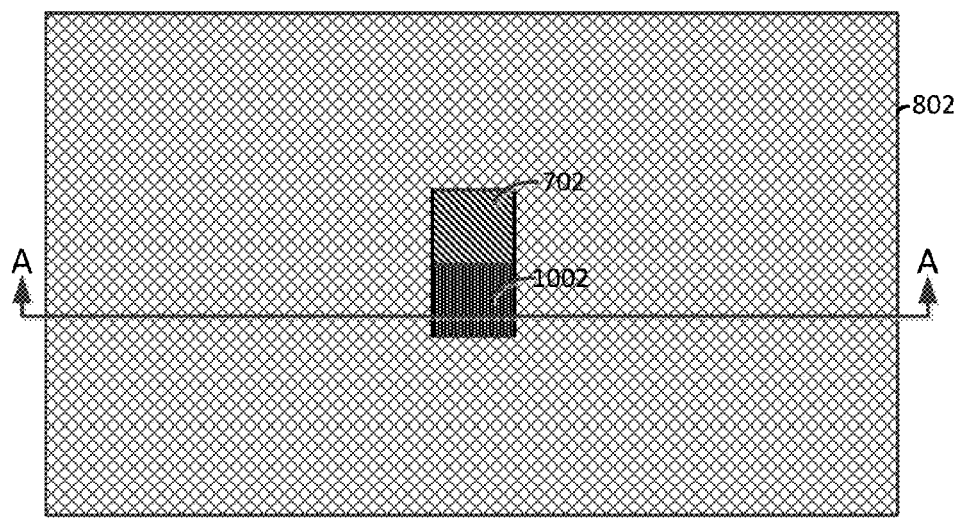
FIG. 10A illustrates a top view following an epitaxial growth process.
Figure 10B:
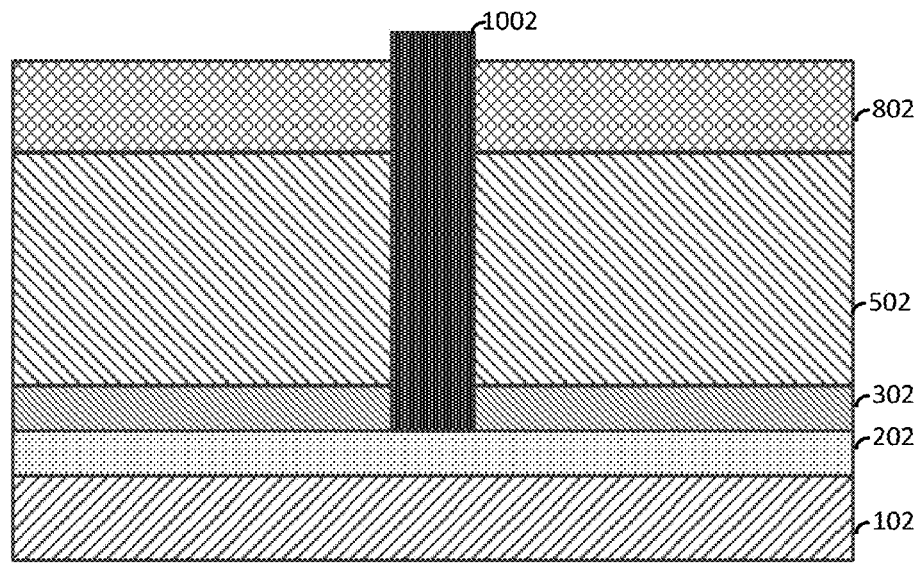
FIG. 10B illustrates a cut-away view along the line A-A of FIG. 10A.

FIG. 10A illustrates a top view following an epitaxial growth process that grows doped semiconductor material such as, for example, a silicon material in the cavity 902 (of FIG. 9) to form a source region extension portion 1002. FIG. 10B illustrates a cut-away view along the line A-A of FIG. 10A. Referring to FIG. 10B, the source region extension portion 1002 contacts the source layer 202.

Figure 11A:
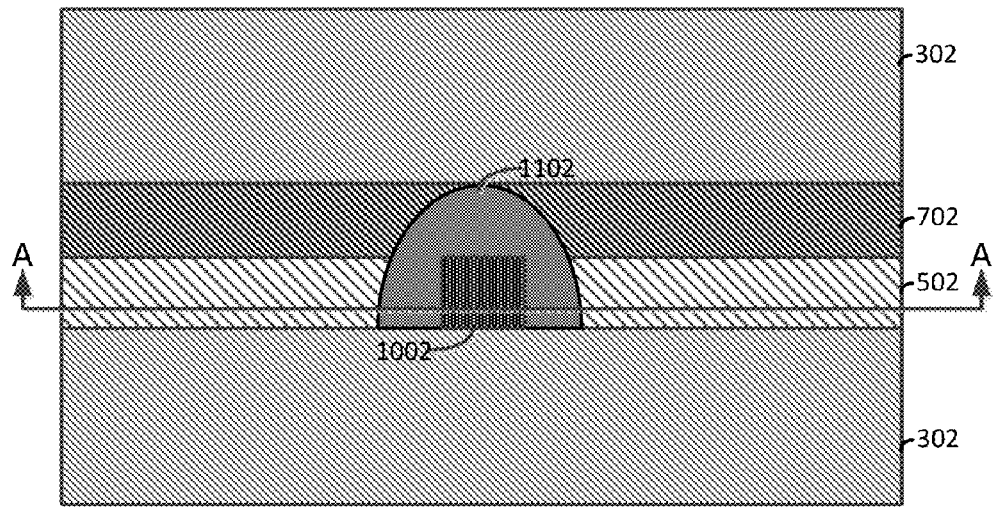
FIG. 11A illustrates the resultant structure following the removal of the hardmask layer.
Figure 11B:
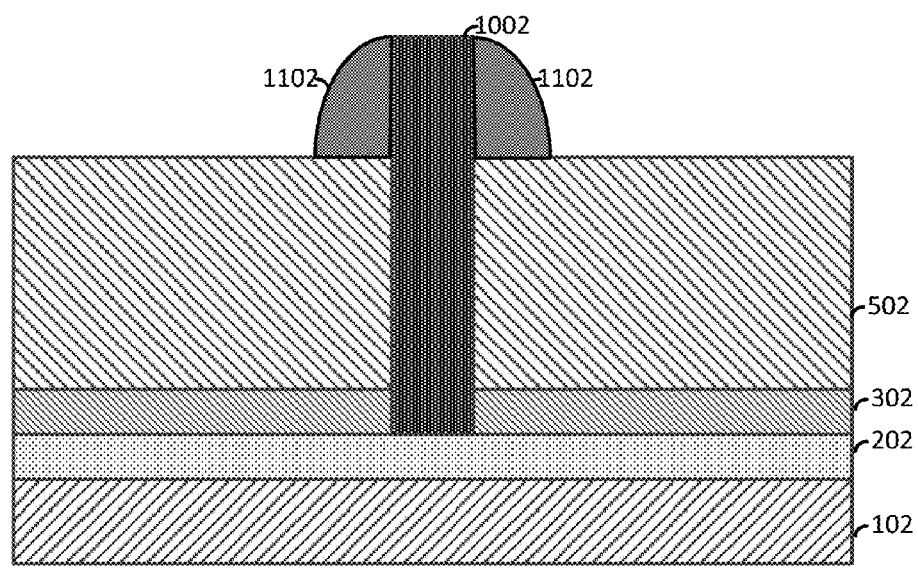
FIG. 11B illustrates a cut-away view along the line A-A of FIG. 11A.

FIG. 11A illustrates the resultant structure following the removal of the hardmask layer 802 (of FIG. 10A) and the growth of a spacer 1102 around portions of the source region extension portion 1002 and on the fin 502 and nitride layer 702. The spacer 1102 is formed by, for example, an isotropic deposition followed by an anisotropic etching process. FIG. 11B illustrates a cut-away view along the line A-A of FIG. 11A.

Figure 12A:
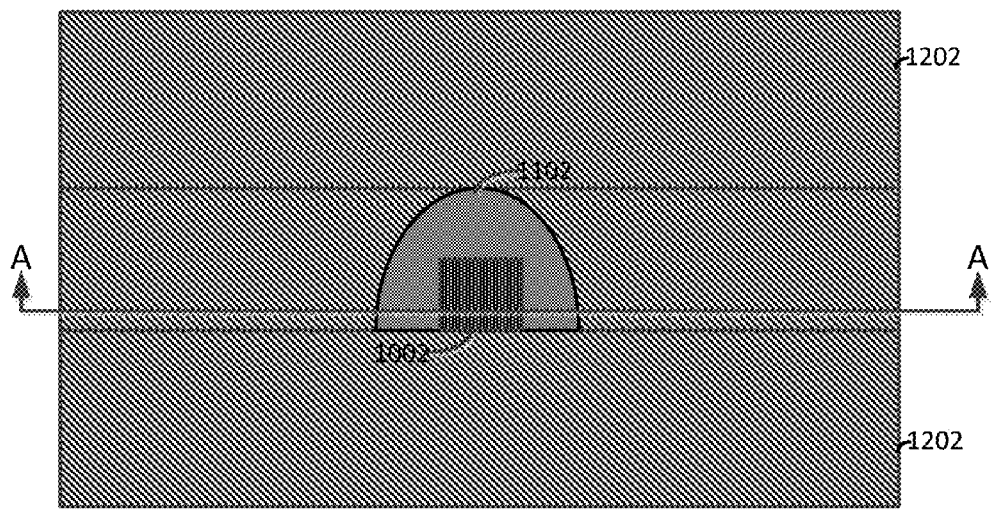
FIG. 12A illustrates a top view following the deposition of a layer of nitride material.
Figure 12B:
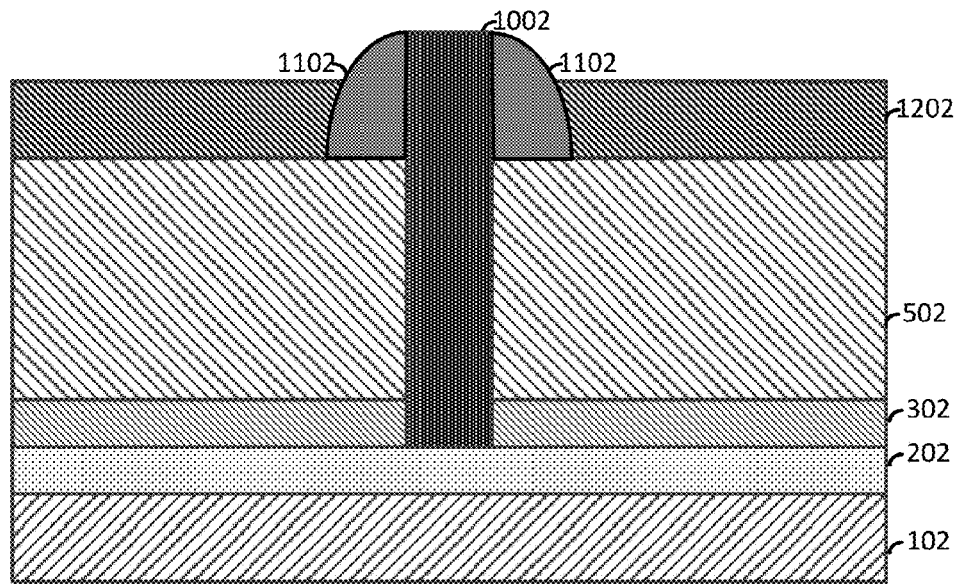
FIG. 12B illustrates a cut-away view along the line A-A of FIG. 12A.

FIG. 12A illustrates a top view following the deposition of a layer of nitride material 1202 such as, for example, silicon nitride over exposed portions of the fin 502 the nitride layer 702 and the sacrificial layer 302. FIG. 12B illustrates a cut-away view along the line A-A of FIG. 12A. Referring to FIG. 12B, after the nitride layer 1202 is deposited, a planarization process such as, for example, chemical mechanical polishing (CMP) is performed, which stops when the source region extension portion 1002 is exposed. Following the planarization process, an anisotropic etching process is performed to further reduce the thickness of the nitride layer 1202.

Figure 13A:
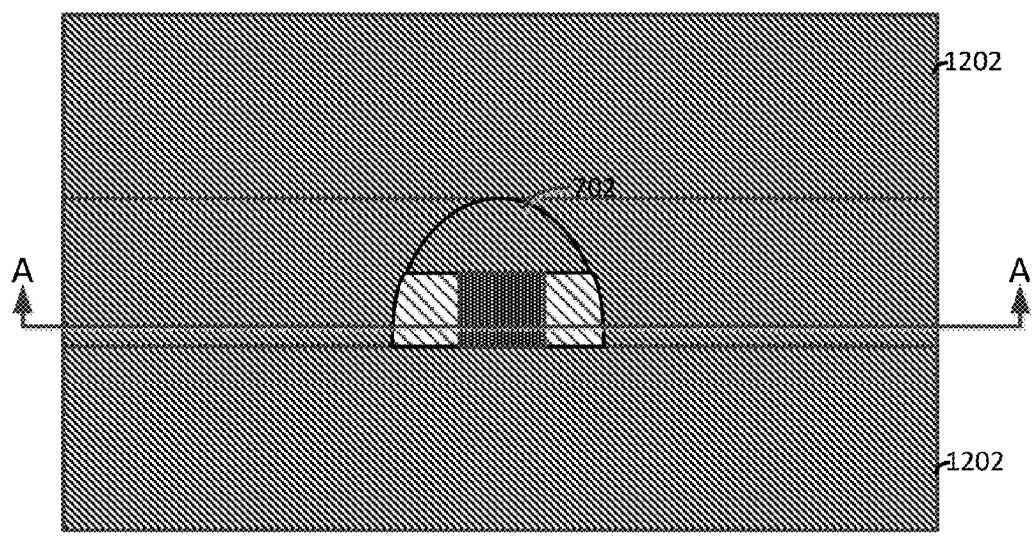
FIG. 13A illustrates a top view following the removal of the spacer.
Figure 13B:
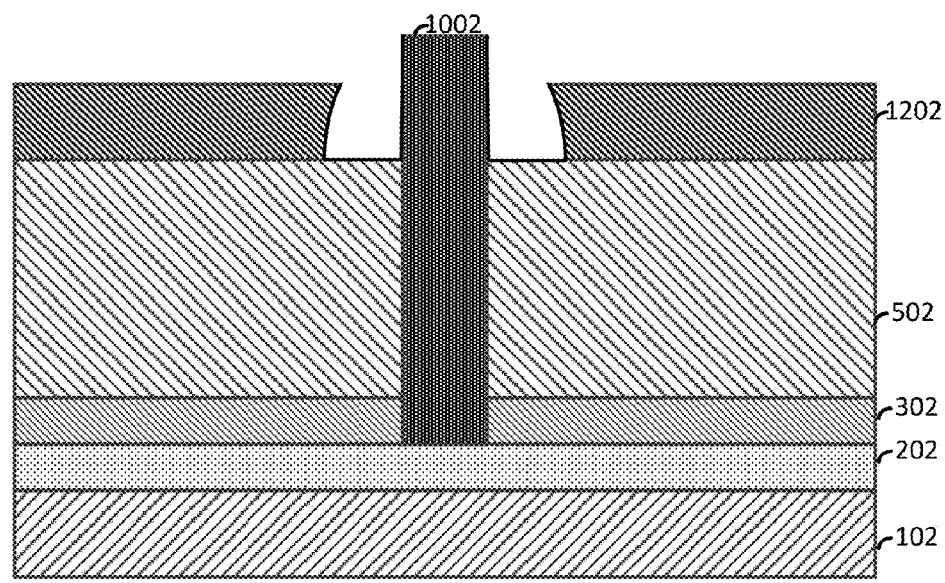
FIG. 13B illustrates a cut-away view along the line A-A of FIG. 13A.

FIG. 13A illustrates a top view following the removal of the spacer 1102, using for, example, an isotropic etching process such as a hydrofluoric etching process, which exposes portion of the nitride layer 702 and the fin 502. FIG. 13B illustrates a cut-away view along the line A-A of FIG. 13A.

Figure 14A:
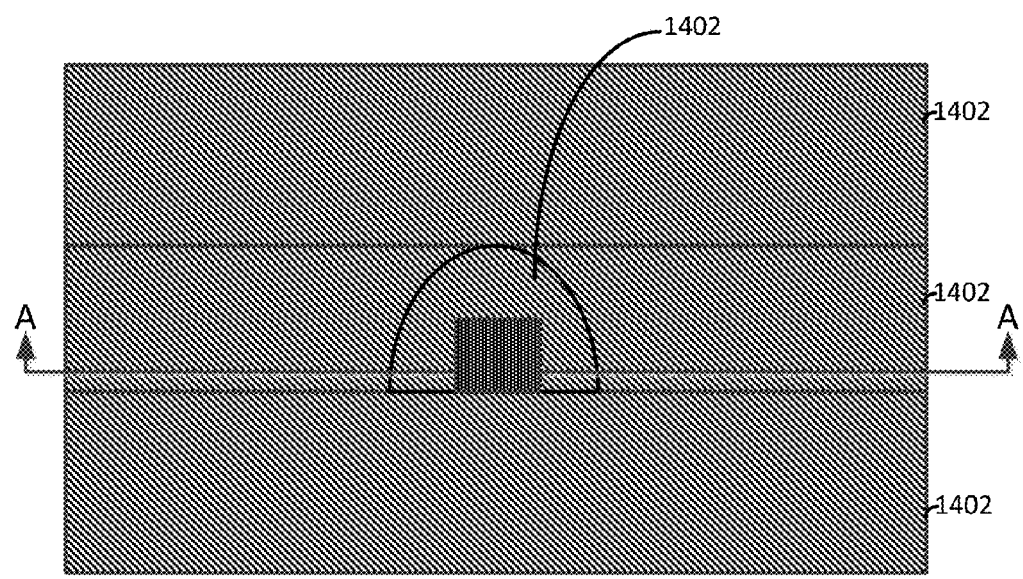
FIG. 14A illustrates a top view following the formation of a second nitride layer.
Figure 14B:
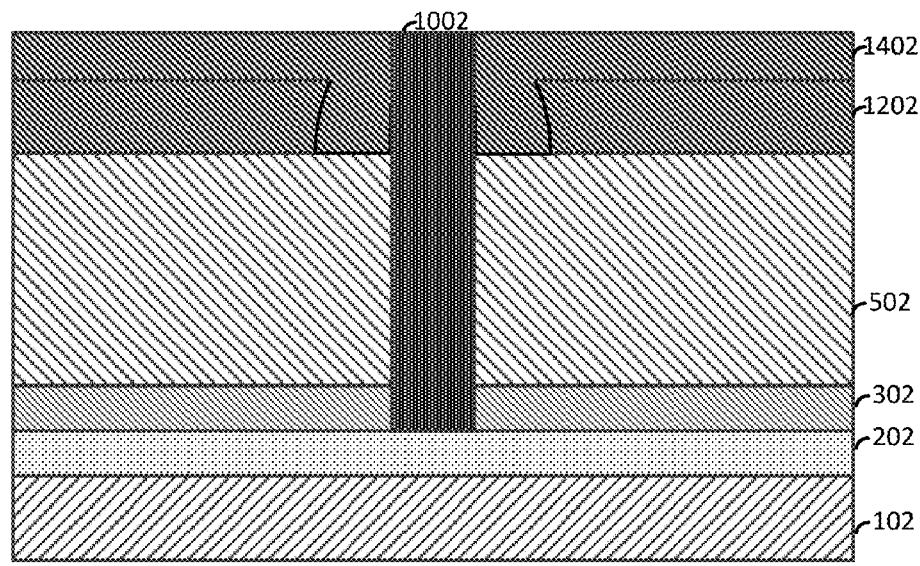
FIG. 14B illustrates a cut-away view along the line A-A of FIG. 14A.

FIG. 14A illustrates a top view following the formation of a second nitride layer 1402 over the nitride layer 1202 (of FIG. 13A) and exposed portions of the fin 502 (of FIG. 13A). FIG. 14B illustrates a cut-away view along the line A-A of FIG. 14A. Referring to FIG. 14B, following the deposition of the second nitride layer 1402, a planarization process such as, for example, CMP is performed that ceases when the source region extension portion 1002 is exposed.

Figure 15A:
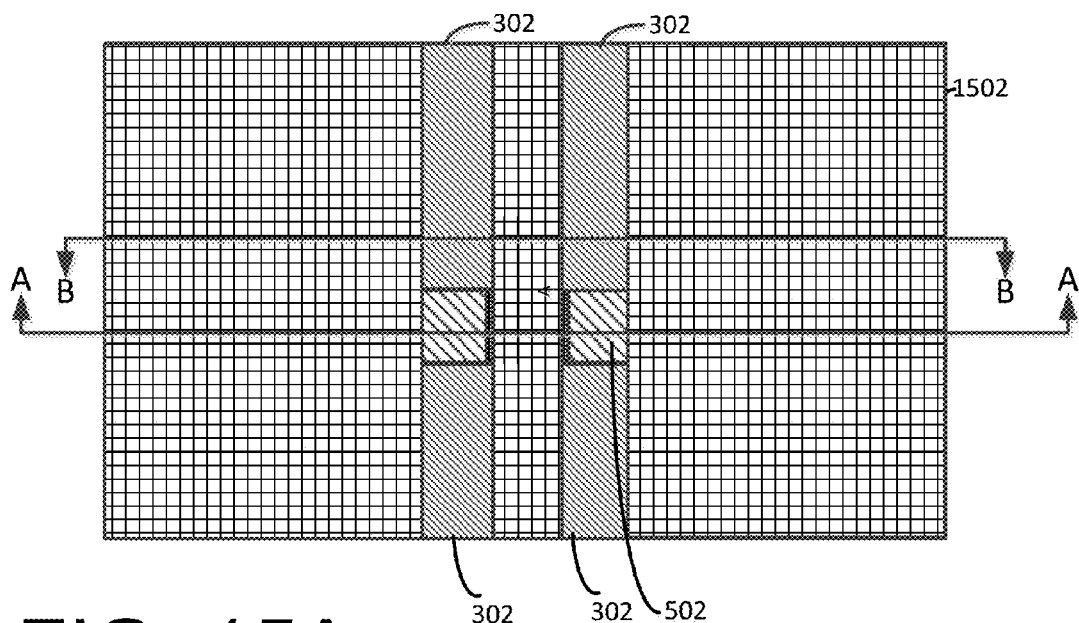
FIG. 15A illustrates a top view following the patterning and deposition of a photoresist layer.
Figure 15B:
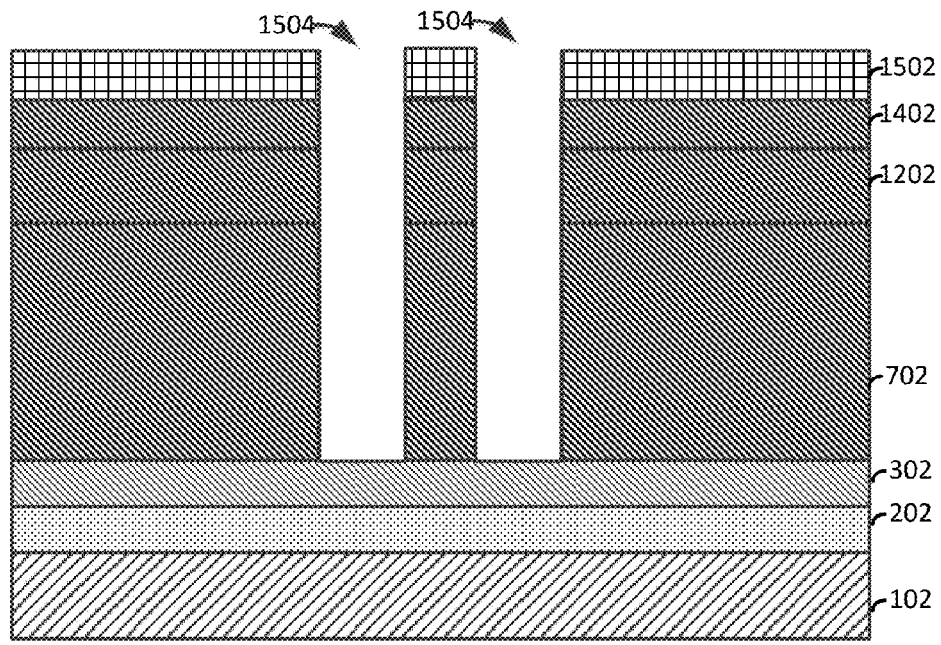
FIG. 15B illustrates a cut-away view along the line B-B of FIG. 15A.
Figure 15C:
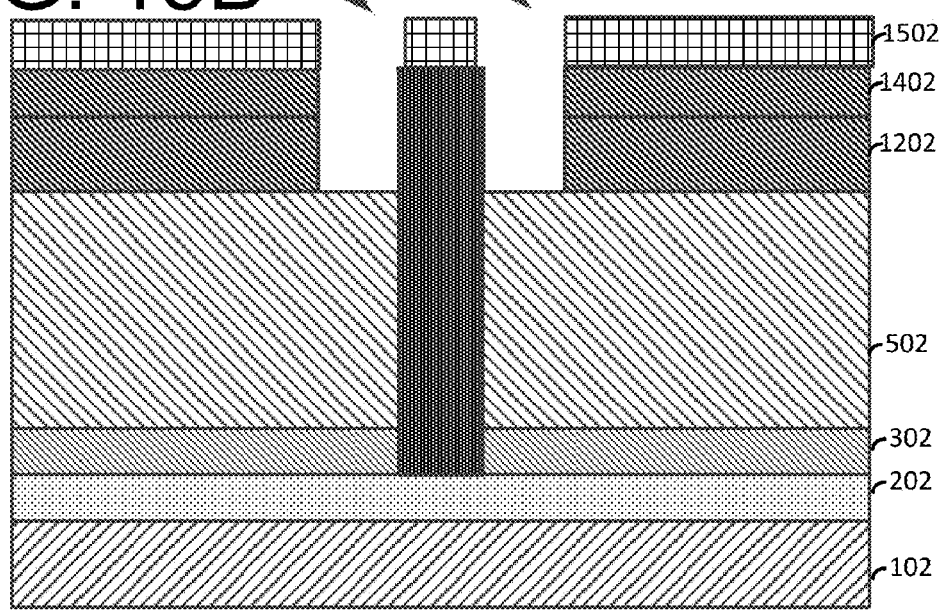
FIG. 15C illustrates a cut-away view along the line A-A of FIG. 15A.

FIG. 15A illustrates a top view following the patterning and deposition of a photoresist layer 1502 and an etching process such as, for example, RIE that removes exposed portions of nitride material from the nitride layers 702, 1202 and 1402. FIG. 15B illustrates a cut-away view along the line B-B of FIG. 15A. Referring to FIG. 15B, the etching process results in cavities 1504 that expose portions of the sacrificial layer 302. FIG. 15C illustrates a cut-away view along the line A-A of FIG. 15A. FIG. 15C illustrates the cavities 1506 that are formed in the etching process. The cavities 1506 expose portions of the fin 502.

Figure 16A:
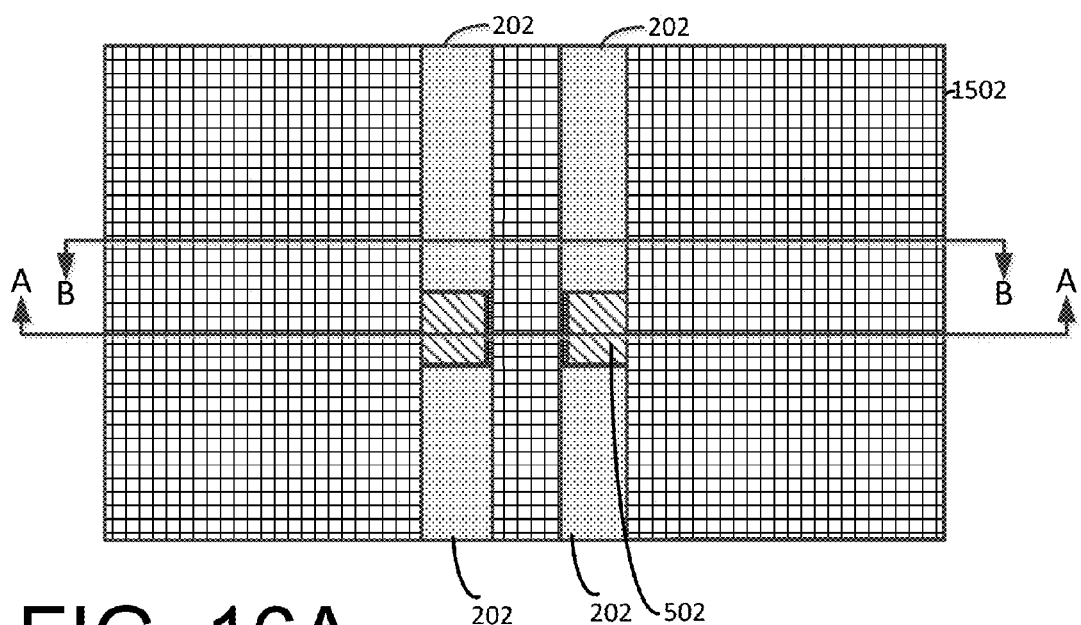
FIG. 16A illustrates a top view of the resultant structure following an isotropic etching process.
Figure 16B:
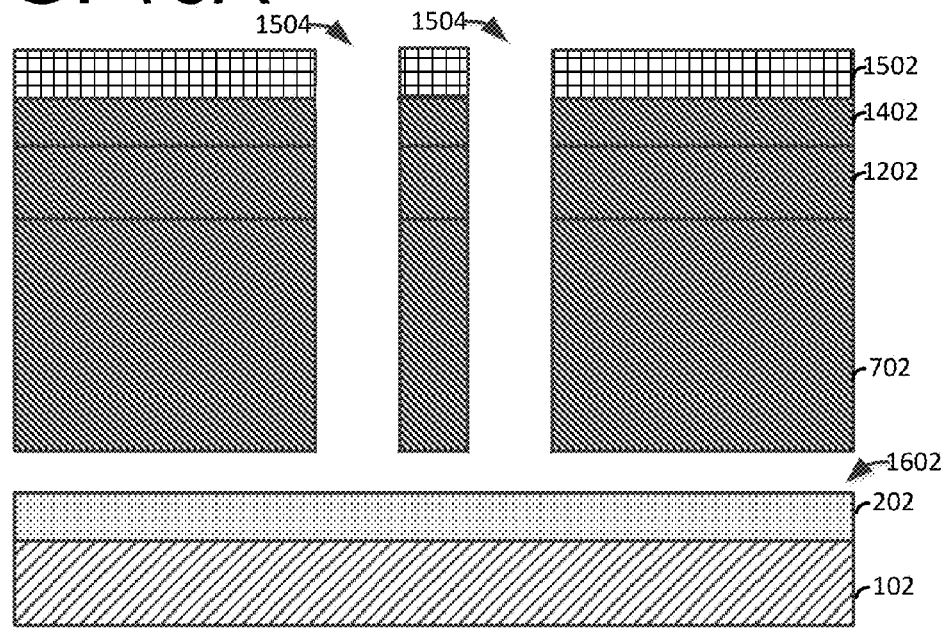
FIG. 16B illustrates a cut-away view along the line B-B of FIG. 16A.
Figure 16C:
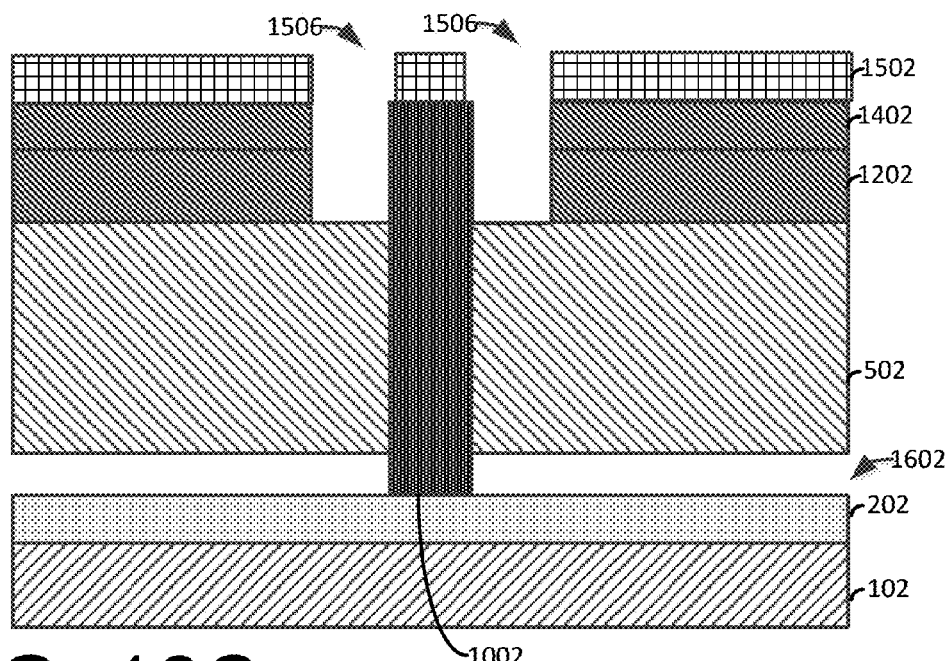
FIG. 16C illustrates a cut-away view along the line A-A of FIG. 16A.

FIG. 16A illustrates a top view of the resultant structure following an isotropic etching process such as, for example, a hydrochloric wet etching process that is selective to the material of the sacrificial layer 302. The removal of the sacrificial layer 302 exposes the source layer 202. FIG. 16B illustrates a cut-away view along the line B-B of FIG. 16A. FIG. 16C illustrates a cut-away view along the line A-A of FIG. 16A. FIGS. 16B and 16C show a void 1602 that is partially defined by the source layer 202, the fin 502 and the nitride layer 702.

Figure 17A:
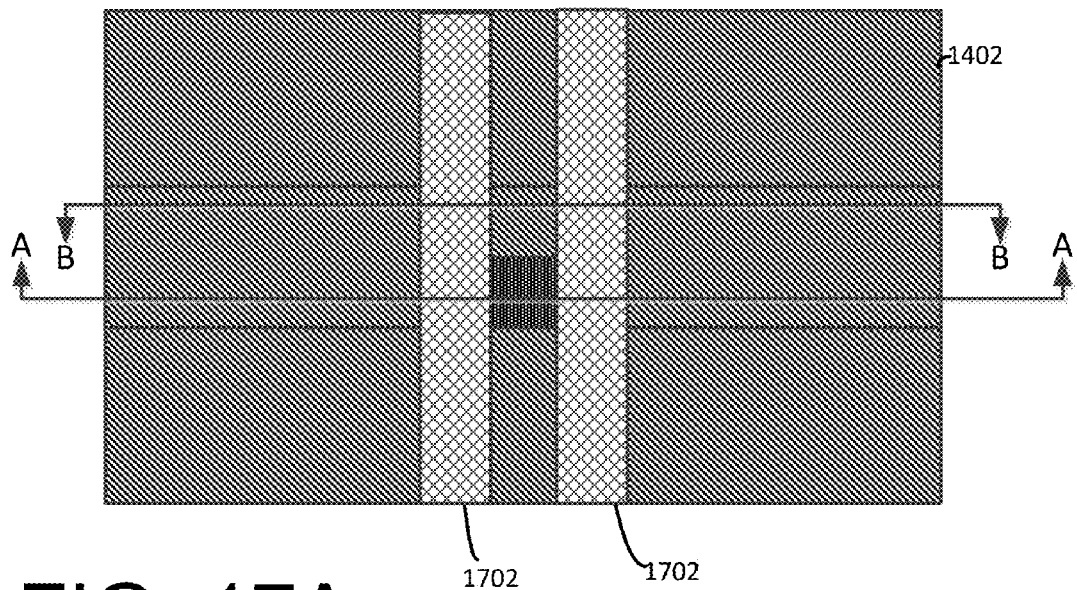
FIG. 17A shows a top view following the removal of the photoresist layer and the deposition of an insulating material.
Figure 17B:
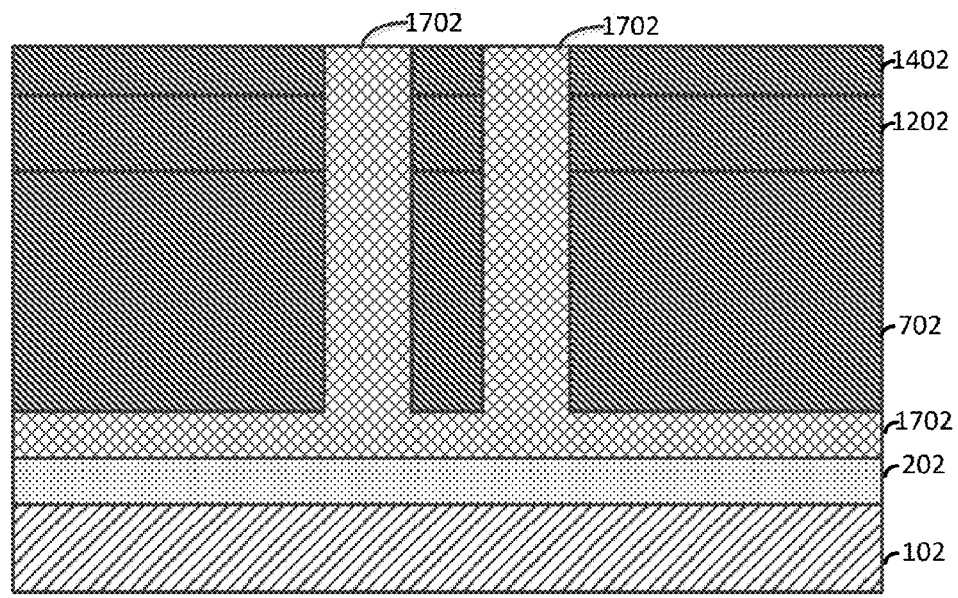
FIG. 17B shows a cut-away view along the line B-B of FIG. 17A.
Figure 17C:
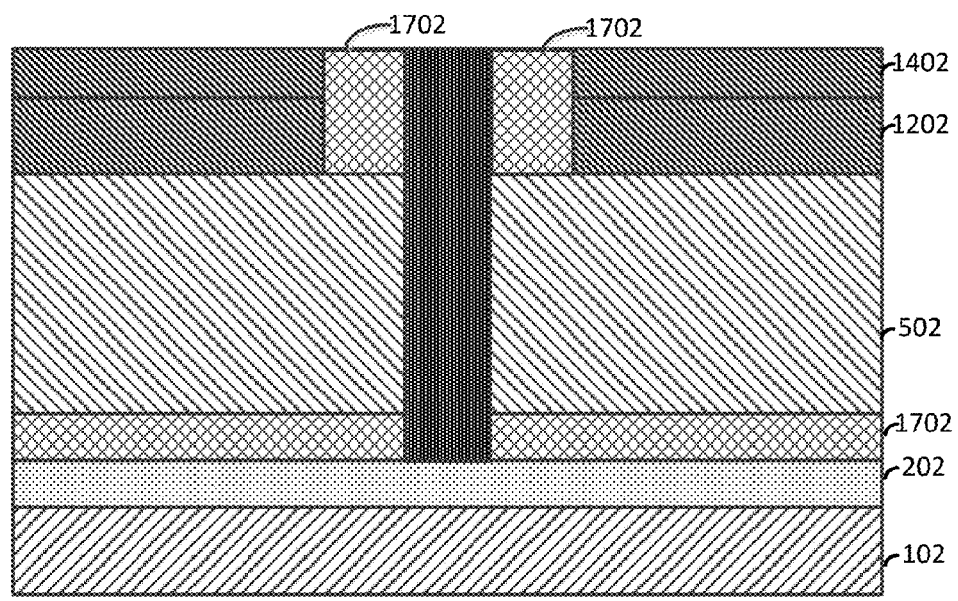
FIG. 17C shows a cut-away view along the line A-A of FIG. 17A.

FIG. 17A shows a top view following the removal of the photoresist layer 1502 (of FIG. 16A) and the deposition of an insulating material 1702. The insulating material 1702 may include, for example, an oxide material that is formed in the cavities 1504 and 1506 (of FIGS. 15B and 15C) and the void formed by the removal of the sacrificial layer 302 (of FIG. 15). Following the deposition of the insulating material 1702, a planarization process such as, for example, CMP is performed that exposes the second nitride layer 1402. FIG. 17B shows a cut-away view along the line B-B of FIG. 17A, and FIG. 17C shows a cut-away view along the line A-A of FIG. 17A.

Figure 18A:
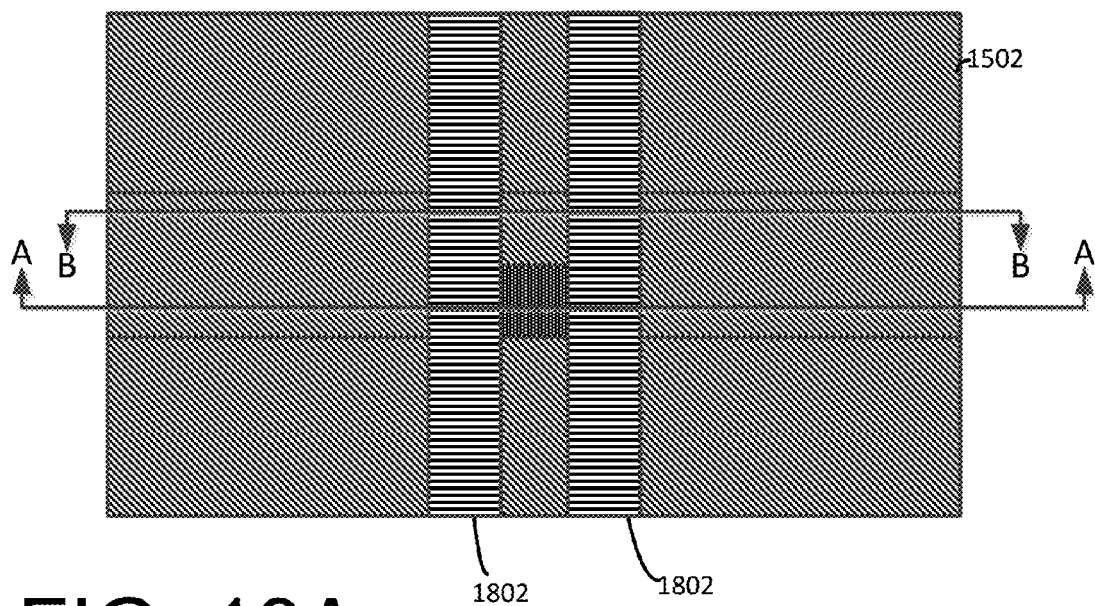
FIG. 18A illustrates a top view following the formation of gate stacks.
Figure 18B:
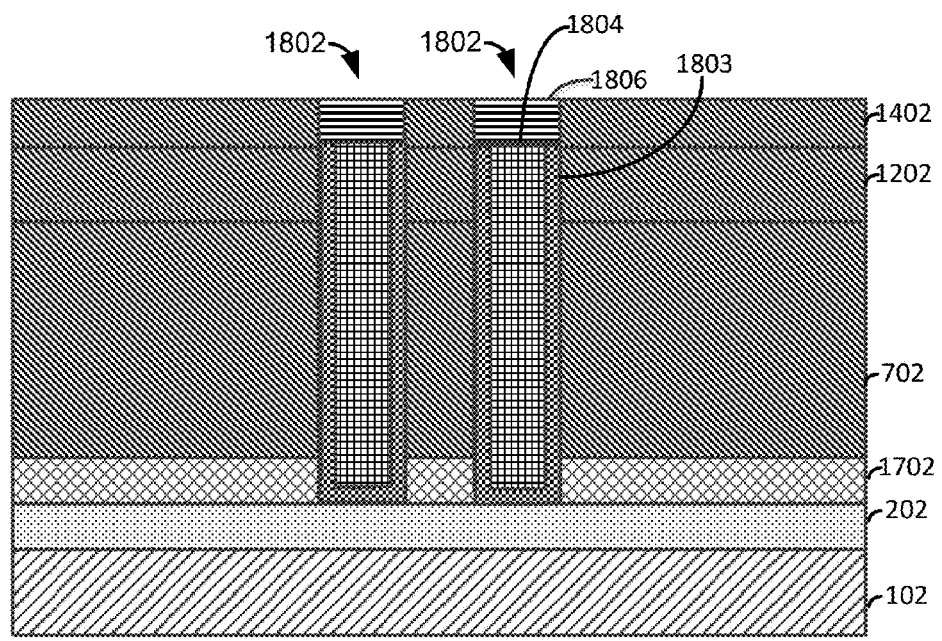
FIG. 18B illustrates a cut-away view along the line B-B of FIG. 18A.
Figure 18C:
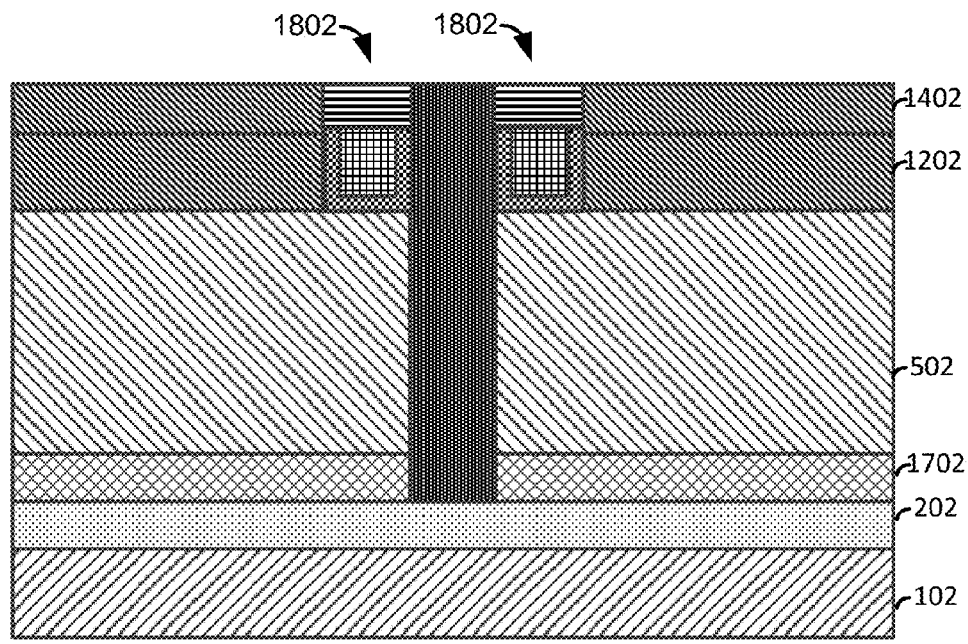
FIG. 18C illustrates a cut-away view along the line A-A of FIG. 18A.

FIG. 18A illustrates a top view following the formation of gate stacks 1802. The gate stacks 1802 are formed following an anisotropic etching process that removes exposed portions of the insulating material 1702 to expose the fin 502 (of FIG. 17C). FIG. 18B illustrates a cut-away view along the line B-B of FIG. 18A. Referring to FIG. 18B, the gate stack 1802 includes a gate insulator 1803 that lines exposed portions of the nitride layer 1202, the nitride layer 702 and the fin 502 (of FIG. 17C). A gate metal 1804 is deposited over the gate insulator 1803. A capping layer 1806 is disposed over the gate stack 1802. FIG. 18C illustrates a cut-away view along the line A-A of FIG. 18A.

In some aspects, the gate stack 1802 includes high-k metal gates formed, for example, by filling a dummy gate opening (not shown) with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum. The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used.

In some aspects, the gate stack structure 1802 can include a work function metal(s) that may be disposed over the high-k dielectric material. The type of work function metal(s) depends on the type of transistor and may differ. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Figure 19:
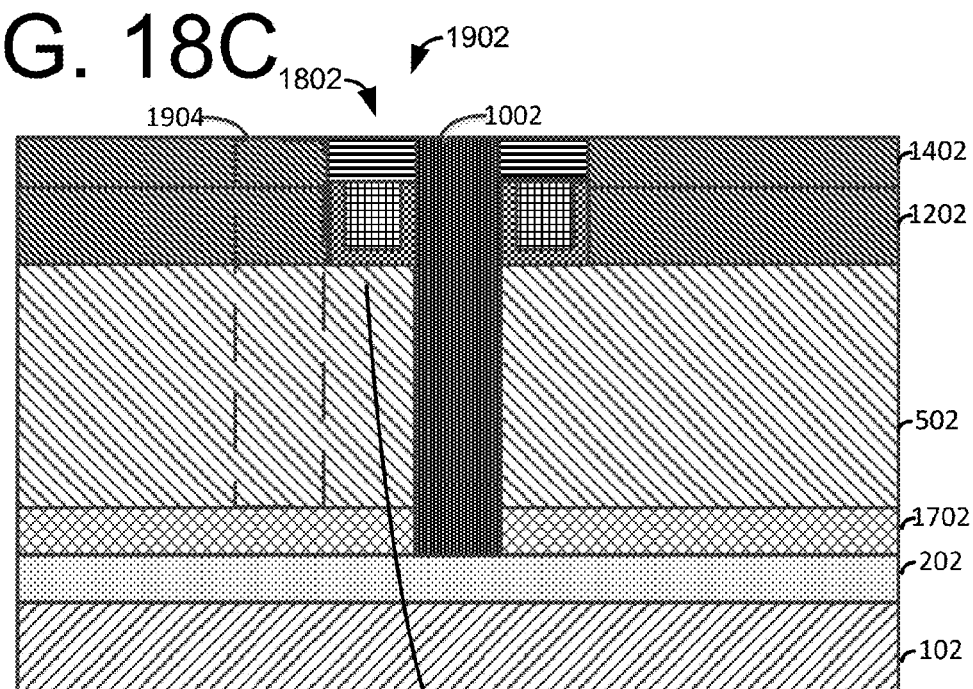
FIG. 19 illustrates a side cut-away view along the line B-B of FIG. 18A.

FIG. 19 illustrates a side cut-away view along the line B-B of FIG. 18A. The device 1902 includes a gate stack 1802, a drain region 1904, and a channel region 1906. The source region of the device includes the source region extension portion 1002 and the source layer 202. The drain regions 1904 are doped using, for example, an ion implantation or elective epitaxial growth process.

Figure 20:
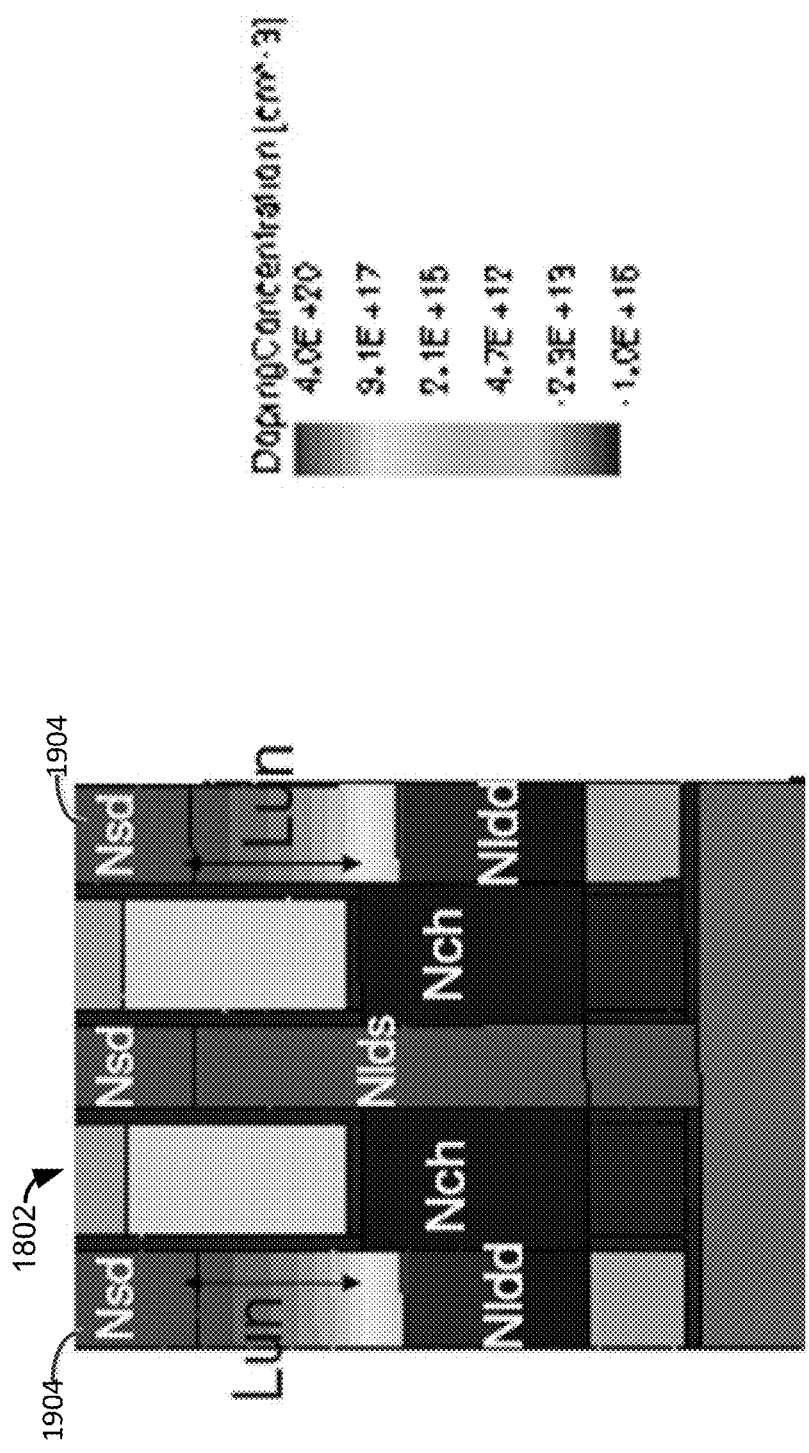
FIG. 20 illustrates a cut-away view along the line B-B of FIG. 18A.

FIG. 20 illustrates a cut-away view along the line B-B of FIG. 18A. FIG. 20 shows the dopant concentrations for different portions of the device 1902. The drain regions 1904 are heavily doped (nominally $4 \times 10^{20}$ per cubic nanometer ($nm^3$)) at the surface of the region labeled $N_{sd}$. The drain region 1904 has an underlap region labeled $L_{un}$ with a gradated doping concentration such that the doping concentration in the drain region 1904 is reduced further from the surface to the $N_{ldd}$ region that has a doping concentration of approximately $1.0 \times 10^{15}$ per $nm^3$. The source region of the device 1902 has a doping concentration of about $4 \times 10^{20}$ per $nm^3$.

The embodiments described herein provide a method for fabricating a FinFET device that has an asymmetric doping profile for the source and drain regions. In particular the source region has a high doping concentration, while the drain regions have a graduated lower doping concentration. The asymmetric FinFET has better current drive compared to symmetrically doped finFET devices. The device has a high dielectric constant that reduces the channel resistance and the accumulation resistance in the source region extension portion.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a field effect transistor device, the method comprising:
   forming a doped layer on a semiconductor substrate;
   forming a sacrificial layer on the doped layer;
   forming a fin on the sacrificial layer, the fin having a nitride portion and a semiconductor portion;
   etching to remove a portion of the semiconductor portion of the fin to expose a portion of the doped layer;
   growing a semiconductor material from the exposed portion of the doped layer;
   depositing a first nitride layer on the fin;
   patterning and etching to remove portions of the nitride layer and define a channel region on the fin;
   etching to remove the sacrificial layer and form a void that exposes a portion of the doped layer;
   depositing an insulator material in the void and the channel region of the fin;
   etching to remove a portion of the insulator material and expose the channel region of the fin; and
   forming a gate stack over the channel region of the fin.

2. The method of claim 1, wherein the sacrificial layer includes a silicon germanium material.

3. The method of claim 1, further comprising forming a spacer on the fin and around the grown semiconductor material prior to depositing the nitride layer on the fin.

4. The method of claim 3, further comprising removing the spacer and depositing a second nitride layer on the first nitride layer.

5. The method of claim 1, wherein the fin includes a silicon material.

6. The method of claim 1, wherein the insulator material includes an oxide material.

7. The method of claim 1, wherein the fin is formed by an epitaxial growth and lithographic patterning and etching process.

8. The method of claim 1, semiconductor material grown from the exposed portion of the doped layer is a doped epitaxially grown silicon material.

9. The method of claim 1, further comprising implanting dopants adjacent to the channel region of the fin prior to forming the gate stack and annealing to form a source region having a graduated concentration of dopants.

10. A method for fabricating a field effect transistor device, the method comprising:
   forming a doped layer on a semiconductor substrate;
   forming a sacrificial layer on the doped layer;
   growing a semiconductor layer on the sacrificial layer;
   patterning the semiconductor layer to form a fin;
   removing a portion of the fin;
   forming a nitride portion of the fin;
   patterning a hardmask layer on the fin;
   etching to remove an exposed portion of the fin and the sacrificial layer to form a cavity that exposes a portion of the doped layer;
   growing a semiconductor material in the cavity;
   forming a spacer on the fin and around the grown semiconductor material;
   depositing a first nitride layer on the fin;
   removing the spacer;
   depositing a second nitride layer on the fin;
   patterning and etching to remove portions of the first nitride layer and the second nitride layer, and define a channel region on the fin;
   etching to remove the sacrificial layer and form a void that exposes a portion of the doped layer;
   depositing an insulator material in the void and the channel region of the fin;
   etching to remove a portion of the insulator material and expose the channel region of the fin; and
   forming a gate stack over the channel region of the fin.

11. The method of claim 10, wherein the sacrificial layer includes a silicon germanium material.

12. The method of claim 10, wherein the fin includes a silicon material.

13. The method of claim 10, wherein the insulator material includes an oxide material.

14. The method of claim 10, wherein the semiconductor material grown in the cavity includes an epitaxially grown material.

15. The method of claim 10, wherein the etching to remove the sacrificial layer includes an isotropic etching process.

* * * * *